United States Patent
Hong et al.

(10) Patent No.: US 9,054,268 B2
(45) Date of Patent: Jun. 9, 2015

(54) METHOD FOR MANUFACTURING ABSORBER LAYER OF THIN FILM SOLAR CELL USING MOCVD

(71) Applicant: ATOMIC ENERGY COUNCIL-INSTITUTE OF NUCLEAR ENERGY RESEARCH, Longtan Township, Taoyuan County (TW)

(72) Inventors: Hwen-Fen Hong, Longtan Township, Taoyuan County (TW); Hou-Ying Huang, Longtan Township, Taoyuan County (TW); Hwa-Yuh Shin, Longtan Township, Taoyuan County (TW)

(73) Assignee: ATOMIC ENERGY COUNCIL-INSTITUTE OF NUCLEAR ENERGY RESEARCH, Longtan Township, Taoyuan County (TW)

(*) Notice: Subject to any disclaimer, the term of this patent is extended or adjusted under 35 U.S.C. 154(b) by 165 days.

(21) Appl. No.: 13/790,481

(22) Filed: Mar. 8, 2013

(65) Prior Publication Data
US 2014/0099749 A1    Apr. 10, 2014

(30) Foreign Application Priority Data
Oct. 5, 2012    (TW) .............................. 101136969 A

(51) Int. Cl.
| H01L 21/00 | (2006.01) |
| H01L 21/20 | (2006.01) |
| H01L 21/36 | (2006.01) |
| H01L 31/18 | (2006.01) |
| H01L 21/02 | (2006.01) |
| H01L 31/032 | (2006.01) |
| C23C 16/30 | (2006.01) |
| C23C 16/448 | (2006.01) |
| C23C 16/56 | (2006.01) |

(52) U.S. Cl.
CPC ...... *H01L 31/1864* (2013.01); *H01L 21/02557* (2013.01); *H01L 21/02568* (2013.01); *H01L 21/0262* (2013.01); *H01L 31/0322* (2013.01); *H01L 31/0326* (2013.01); *Y02E 10/541* (2013.01); *C23C 16/305* (2013.01); *C23C 16/4481* (2013.01); *C23C 16/56* (2013.01)

(58) Field of Classification Search
None
See application file for complete search history.

(56) References Cited

U.S. PATENT DOCUMENTS

| 4,066,481 | A | * | 1/1978 | Manasevit et al. ............... 117/90 |
| 2010/0139762 | A1 | * | 6/2010 | Ohmi et al. .................... 136/256 |
| 2014/0093645 | A1 | * | 4/2014 | Thimsen et al. ........... 427/255.4 |
| 2014/0220728 | A1 | * | 8/2014 | Hillhouse et al. ............... 438/95 |

OTHER PUBLICATIONS

Scragg, J. J. in "Copper Zinc Tin Sulfide Thin Films for Photovoltaics," (2011), Doctoral Thesis accepted by the University of Bath, UK, Springer, pp. 1-204.*

* cited by examiner

*Primary Examiner* — Michael Jung
(74) *Attorney, Agent, or Firm* — Muncy, Geissler, Olds & Lowe, P.C.

(57) ABSTRACT

A method for manufacturing an absorber layer of thin film solar cells is revealed. Firstly vapors of different metal-organic sources are generated in a plurality of containers used for mounting different metal-organic sources. Then the vapors of the metal-organic sources are mixed with a carrier gas and are filled into a reaction together with a reaction gas chamber through pipelines. Next the metals and the compounds are deposited on a substrate in the reaction chamber to form an absorber layer of a thin film solar cell. A flow rate of each metalorganic vapors filled into the reaction chamber is controlled by a mass flow controller respectively.

8 Claims, 5 Drawing Sheets

METHOD FOR MANUFACTURING ABSORBER LAYER OF THIN FILM SOLAR CELL USING MOCVD

BACKGROUND OF THE INVENTION

1. Fields of the Invention

The present invention relates to a method for manufacturing an absorber layer of thin film solar cells, especially to a method for manufacturing an absorber layer of thin film solar cells that controls flow rate of respective element and deposits the respective element to form the absorber layer.

2. Descriptions of Related Art

Compared with monocrystalline silicon solar cells or polycrystalline silicon solar cells, thin-film solar cells have been attracted much attention and considered the next generation of solar cells due to low cost and potential for use in large-area applications.

Main materials for thin-film solar cells include Copper Indium Gallium Diselenide (CuInGaSe2, CIGS), Copper Indium Diselenide (CuInSe2, CIS), Cadmium Telluride (CdTe), etc. Yet indium and gallium in CIGS are rare elements with high costs while selenium is toxic. Thus zinc and tin which are more abundant on earth and less-toxic sulfur are used to replace indium, gallium and selenium respectively. Thus copper zinc tin sulfide ($Cu_2ZnSnS_4$, CZTS) is used to produce an absorber layer of thin-film solar cells.

No matter CIGS or CZTS thin-film solar cells, most of them are prepared by coevaporation or sputtering under vacuum processes. There is room for improvement of energy conversion efficiency of the products.

Refer to FIG. 1, in the coevaporation method, four sets of solid evaporation sources 7 for copper (Cu), zinc (Zn), tin (Sn), sulfur (S), are heated to have changes in physical phase such as sublimation, evaporation, and deposition on a substrate 31 inside a reaction chamber 3 to form a thin film solar cell 5. Moreover, a heater 33 for heating and a monitor 6 for monitoring forming process of the thin film solar cell 5 are also arranged inside the reaction chamber 3.

However, the manufacturing process of the coevaporation method is a single stage process and all reactants reacts at the same time. The reactants are vapors formed by solids being heated and evaporated. Yet the boiling point and the vapor pressure of each reactant are different and this results in difficulty in control of respective quantity. And the vapors may be not mixed well and thus the uniformity and quality of the thin film are affected. The reproducibility of large-area production is reduced.

As to other methods such as sputtering, metal or metal chalcogenide precursors are produced in advance. Then the precursors are set into an environment containing S/Se for high-temperature sulfurization/selenization. The disadvantage of this method is in that this is a two-stage process that incurs additional production cost. This is a great obstacle that needs to be overcome otherwise the cost of the solar cell remains high and this has impact on promotion of the thin film solar cells. Moreover, metals may be evaporated during sulfurization/selenization and this affects the reaction ratio of the reactants. Furthermore, the different stacking order of the metal precursors leads to different timing of sulfurization. Thus there are some secondary phase substances produced including copper sulfide, zinc sulfide, and copper tin sulfide ($Cu_2SnS_3$). The energy conversion efficiency of the products is reduced.

SUMMARY OF THE INVENTION

Therefore it is a primary object of the present invention to provide a method for manufacturing an absorber layer of thin film solar cells in which vapors of a plurality of metal-organic sources and reaction gas are filled into a reaction chamber through different pipelines simultaneously for performing metal-organic chemical vapor deposition (MOCVD) and improving mixing effect and distribution uniformity. Thus the uniformity of the thin film solar cell products is increased.

It is another object of the present invention to provide a method for manufacturing an absorber layer of thin film solar cells in which quantities of a plurality of metal-organic sources and reaction gas are adjusted and controlled by mass flow controllers arranged at pipelines so as to provide good control of various parameters during manufacturing processes easily.

It is a further object of the present invention to provide a method for manufacturing an absorber layer of thin film solar cells that is a single-stage process so that the manufacturing cost is reduced and the method is suitable to be applied to fast mass production.

It is a further object of the present invention to provide a method for manufacturing an absorber layer of thin film solar cells in which each metal component is mixed well with others and is sulfurized/selenized at the same time for effective control of secondary phase products produced.

In order to achieve the above objects, a method for manufacturing an absorber layer of thin film solar cells includes following steps. Firstly generate vapors of a plurality of metal-organic sources in a plurality of containers used for mounting and corresponding to the metal-organic sources respectively. Then fill vapors of the metal-organic sources and a reaction gas into a reaction chamber. Next deposit the vapors of the metal-organic sources and the reaction gas on a substrate in the reaction chamber to form an absorber layer of a thin film solar cell. While filling vapors of the metal-organic sources into the reaction chamber, each metalorganic vapor is controlled by a first mass flow controller correspondingly. The quality of the absorber layer of thin film solar cells is really improved by these steps and the manufacturing cost is reduced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
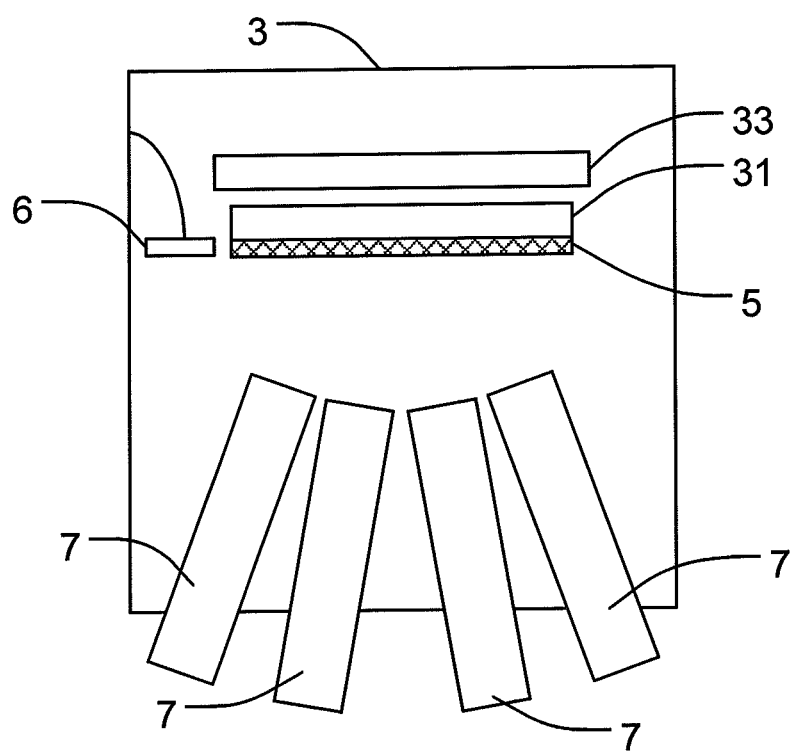
FIG. 1 is a schematic drawing showing a device for the coevaporation method of a prior art.
Figure 2:
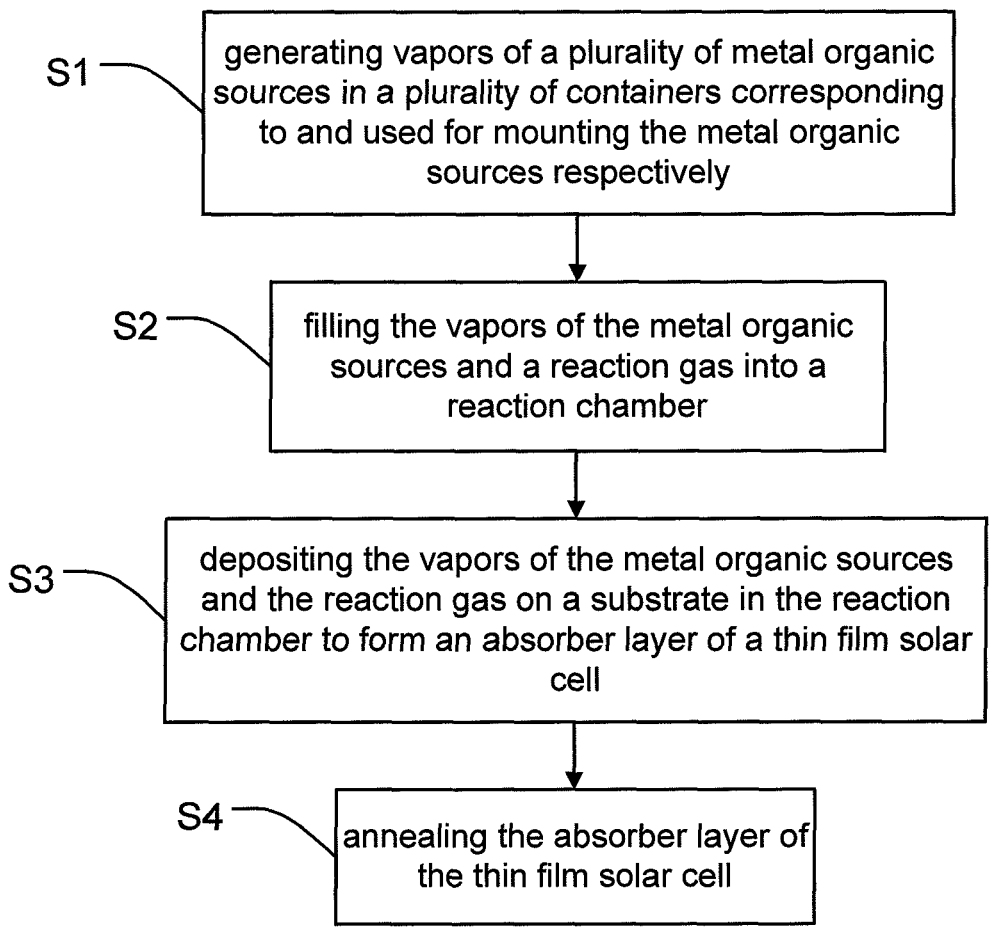
FIG. 2 is a flow chart showing steps of an embodiment according to the present invention.

Refer to FIG. 2, a flow chart of a method for manufacturing an absorber layer of thin film solar cells according to the present invention is revealed. The manufacturing method includes following steps:

Step S1: generating vapors of a plurality of metal-organic sources in a plurality of containers corresponding to and used for mounting the metal-organic sources respectively;

Step S2: filling the vapors of the metal-organic sources and a reaction gas into a reaction chamber;

Step S3: depositing the vapors of the metal-organic sources and the reaction gas on a substrate in the reaction chamber to form an absorber layer of a thin film solar cell;

Step S4: annealing the absorber layer of the thin film solar cell.

The vapor flow of each metal-organic source is controlled by a mass flow controller respectively. Thus the operator can control the vapor amount of each metal-organic source filled into the reaction chamber adequately.

Figure 3:
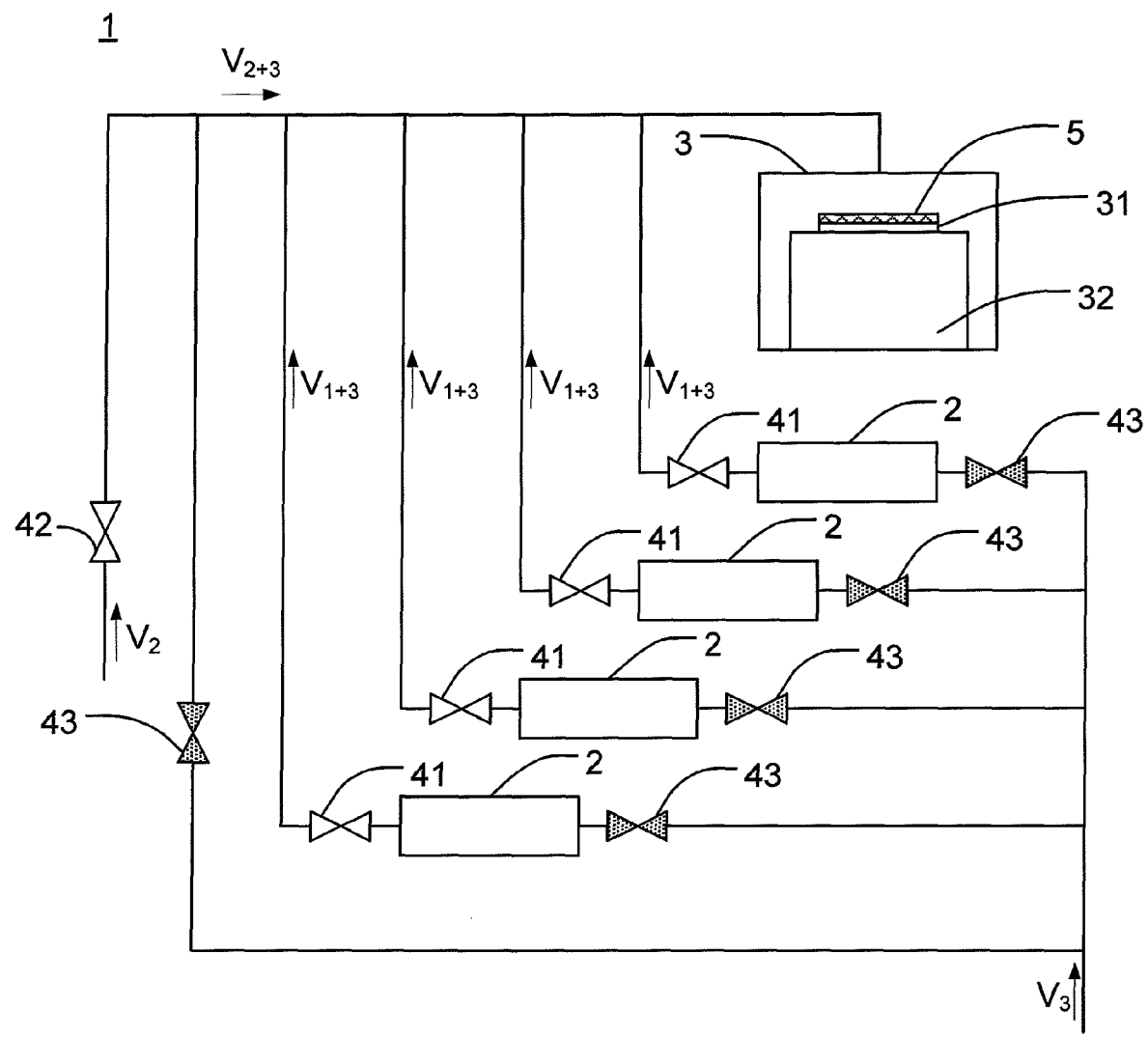
FIG. 3 is a schematic drawing showing a manufacturing device for an absorber layer of a thin film solar cell of an embodiment according to the present invention.

Refer to FIG. 3, a manufacturing device for an absorber layer of a thin film solar cell is disclosed. The manufacturing device for an absorber layer of a thin film solar cell and implementing the above steps of the present invention includes a plurality of containers 2 connected to a reaction chamber 3. The containers 2 are usually stainless steel sealed cans stored with a plurality of different metal-organic sources respectively. After evaporation of these metal-organic sources, metalorganic vapors formed $V_1$ are respectively mixed with a carrier gas $V_3$ then are flowing along pipelines and are entering the vacuum reaction chamber 3 to be deposited on a substrate 31 inside the reaction chamber 3. Thus an absorber layer 5 of a thin film solar cell is formed.

A plurality of first flow controllers 41 for control of the amount of gas flowing in the pipelines is disposed on the pipelines between each container 2 and the reaction chamber 3 respectively. Thus users can control the amount of the metalorganic vapor $V_1$ generated in each container 2 and flowing into the reaction chamber 3 freely. By the disposition of the first mass flow controllers 41 in combination with a film thickness monitor (not shown in figure) in the reaction chamber 3 for providing deposition state related information, user can make an adjustment of the amount of different metalorganic vapors $V_1$ filled into the reaction chamber 3 in real time to reduce damages on the quality caused by secondary phase product or solve problems such as poor uniformity. Thus the energy conversion efficiency of finished products will not be decreased.

In order to manufacture the absorber layer of a thin film solar cell 5, reaction gas containing sulfur (S) or selenium (Se) $V_2$, etc. is also filled besides the metalorganic vapors $V_1$. The amount of the reaction gas containing S/Se $V_2$ filled into the reaction chamber 3 is controlled by a second mass flow controller 42 arranged at a pipeline.

The metalorganic vapors $V_1$ and the reaction gas containing S/Se $V_2$ respectively do not flow in pipelines and fill the reaction chamber 3 alone. They are carried by the carrier gas $V_3$ to flow more smoothly. The flow rate of each carrier gas $V_3$ is also controlled by a third mass flow controller 43 on the pipeline.

The metal-organic sources used to produce metalorganic vapors $V_1$ of the present invention include copper, zinc, tin, etc. Users can use different metal-organic sources according to the types of the absorber layer 5 of the thin film solar cell they intend to prepare while the same steps of the manufacturing method are followed. The carrier gas $V_3$ can be nitrogen gas or inert gases.

Figure 4:
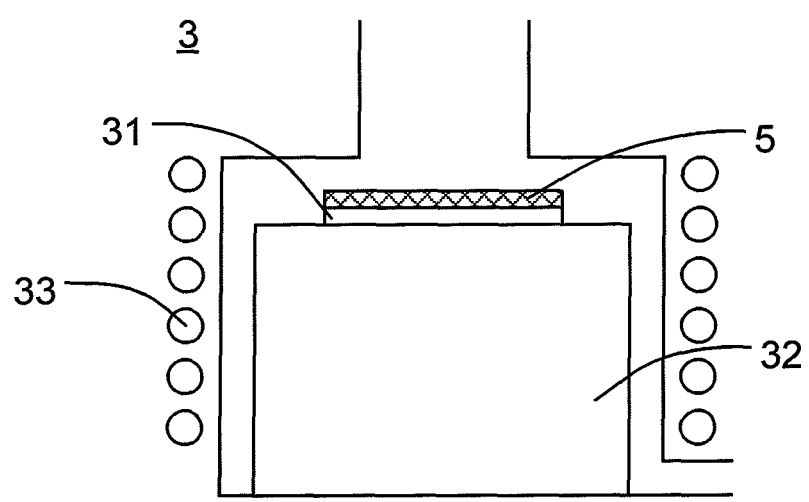
FIG. 4 is a schematic drawing showing a reaction chamber of an embodiment according to the present invention.

Refer to FIG. 4, the substrate is loaded on a graphite susceptor 32 in the reaction chamber 3. A plurality of heaters 33 is arranged around the reaction chamber 3 for performing annealing of the absorber layer 5 of the thin film solar cell and providing energy to increase crystallinity of the absorber layer 5. There is no limitation on the form of the heater 33. Moreover, a heating plate can be arranged under the graphite susceptor 32 to be used for annealing.

Figure 5:
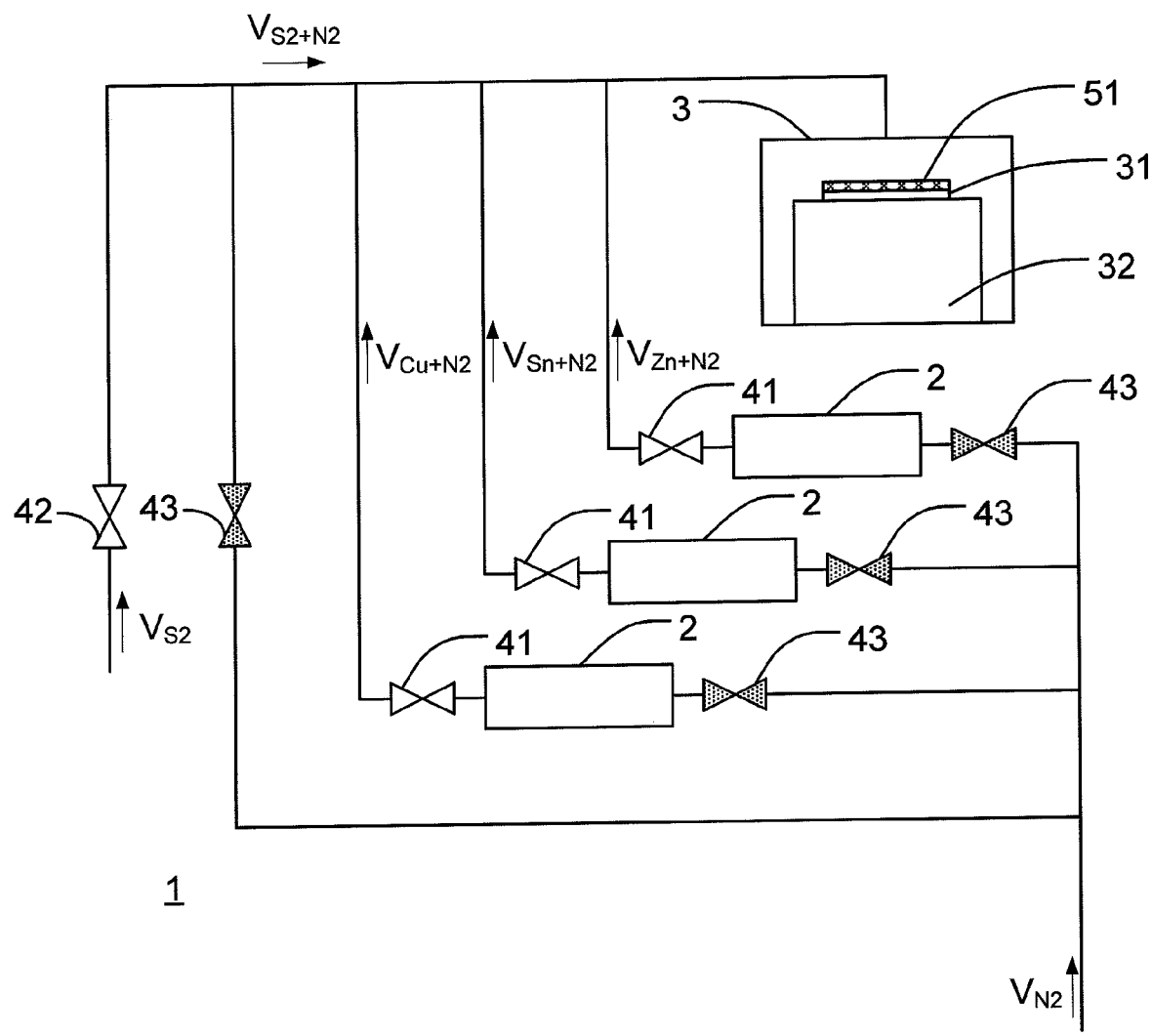
FIG. 5 is a schematic drawing showing a manufacturing device for an embodiment according to the present invention.

Refer to FIG. 2 and FIG. 5, take manufacturing of a Copper Zinc Tin Sulfide (CZTS, Cu2ZnSnS4) thin film as an example. In the manufacturing processes of a CZTS thin film 51, the metal-organic sources used are $(CF_3COCHCOCF_3)_2Cu$, $(C_2H_5)_2Zn$ and $(CH_3)_4Sn$ while the reaction gas containing sulfur is $H_2S$. The temperature of the reaction chamber 3 is pre-heated to 200° C.~1000° C. that is suitable for performing metal-organic chemical vapor deposition (MOCVD). Users can adjust the ratio of nitrogen gas $V_{N2}$, reaction gas containing sulfur $V_{S2}$, vapor containing copper $V_{Cu}$, vapor containing tin $V_{Sn}$, and vapor containing zinc $V_{Zn}$, by the valves including the first flow controllers 41, the second flow controller 42 and the third flow controllers 43. The ideal ratio of Cu, Zn, Sn and S is 1.8:1.2:1:4.

After the CZTS thin film 51 being formed by deposition of these metals, perform annealing in the reaction chamber 3. The annealing temperature is ranging from 200° C.~800° C. that can increase crystallinity of the CZTS thin film 51. At this moment, pure nitrogen gas or other gas mixture is introduced into the reaction chamber 3.

In summary, the method for manufacturing an absorber layer of thin film solar cells according to the present invention is based on the metal-organic chemical vapor deposition (MOCVD). Take a CZTS thin film as an example. Vapors of different elements including copper, zinc, tin, sulfur, etc. are formed in different containers/evaporators or provided by external pipelines. Then the vapors are introduced into a reaction chamber under the control and adjustment of the user. The CZTS thin film is formed by this single-stage manufacturing process. There is no need to prepare precursors first and then perform sulfidation. Moreover, the mixing effect is improved and the uniformity is increased. Thus the manufacturing method can be applied to produce large-area monocrystalline materials. As to the problem of the secondary phase, the user can adjust and control dosing of the reactants in real time manner and a feedback loop by a plurality of mass flow controllers and further increase the energy conversion efficiency of the product. Therefore the method for manufacturing an absorber layer of thin film solar cells of the present invention has economic and industrial benefits.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A method for manufacturing an absorber layer of thin film solar cells comprising the steps of:
    (1) generating a plurality of metal-organic vapors from a plurality of metal-organic sources contained in a plurality of containers;
    (2) filling the metal-organic vapors and at least one reaction gas into a reaction chamber, a reaction gas is selected from the group including a reaction gas containing sulfur (S) and a reaction as containing selenium (Se);
    (3) depositing the metal-organic vapors and the reaction gas on a substrate in the reaction chamber to form an absorber layer of a thin film solar cell;
    wherein each of the metal-organic vapors is controlled by a first mass flow controller correspondingly while the metal-organic vapors being filled into the reaction chamber; a flow of the reaction gas containing sulfur or a flow of the reaction gas containing selenium is controlled by a second mass flow controller.

2. The method as claimed in claim 1, wherein the metal-organic vapors, the reaction gas containing sulfur and the reaction gas containing selenium are respectively mixed with a carrier gas before being filled into the reaction chamber.

3. The method as claimed in claim 2, wherein the carrier gas is selected from the group consisting of nitrogen gas and inert gases.

4. The method as claimed in claim 2, wherein a flow of the carrier gas is controlled by a third mass flow controller.

5. The method as claimed in claim 1, wherein the metal-organic source is selected from the group including copper, zinc, and tin.

6. The method as claimed in claim 1, wherein in the step of depositing the metal-organic vapors and the reaction gas on a substrate in the reaction chamber to form an absorber layer of a thin film solar cell, a temperature of the reaction chamber is ranging from 200° C. to 1000° C.

7. The method as claimed in claim 1, wherein the method further includes a step of annealing the absorber layer of the thin film solar cell after the step of depositing the metal-organic vapors and the reaction gas on a substrate in the reaction chamber to form an absorber layer of a thin film solar cell.

8. The method as claimed in claim 7, wherein a temperature of annealing is ranging from 200° C. to 800° C.

* * * * *